United States Patent [19]

Ernyei et al.

[11] 4,197,516
[45] Apr. 8, 1980

[54] BRIDGED ELECTROMECHANICAL FILTERS

[75] Inventors: Herbert Ernyei; Etienne Langolis, both of Paris, France

[73] Assignee: Lignes Telegraphiques et Telephoniques, Paris, France

[21] Appl. No.: 897,725

[22] Filed: Apr. 19, 1978

[30] Foreign Application Priority Data

Apr. 25, 1977 [FR] France ................... 77 12411

[51] Int. Cl.² .......... H03H 9/26; H03H 9/00
[52] U.S. Cl. ..................... 333/198; 333/197
[58] Field of Search ............ 333/71, 72, 197–198

[56] References Cited

U.S. PATENT DOCUMENTS

| 3,440,572 | 4/1969 | Bise | 333/71 X |
| 3,725,828 | 4/1973 | Temes | 333/71 |

*Primary Examiner*—Alfred E. Smith
*Assistant Examiner*—Marvin Nussbaum
*Attorney, Agent, or Firm*—Kemon and Estabrook

[57] ABSTRACT

An electromechanical bandpass filter includes at least one real pole consisting of vibrating resonators and couplers between adjacent resonators arranged as filter cells connected in parallel. Each cell includes a coupler and a half of each of the adjacent resonators. At least one bridge extends over at least one resonator and the image mobility of the cells which are spanned by the bridge is equal to the image mobility of the cells in an unbridged electromechanical filter of the same type and having the same passband.

6 Claims, 11 Drawing Figures $$\frac{Y_p}{Y_c} = \frac{\Delta f_p}{\Delta f_o} + \sqrt{\left(\frac{\Delta f_p}{\Delta f_o}\right)^2 - 1} \quad ; \quad \frac{Y_c'}{Y_c} = \frac{1}{\sqrt{1 - Y_c^2/Y_p^2}} \quad ; \quad \frac{f_o' - f_o}{\Delta f_o} = \varepsilon \frac{Y_c}{Y_p}$$

$\varepsilon = 1$ : for a $\lambda/4$ bridge $\varepsilon = -1$ : for a $3\lambda/4$ bridge $$a = \frac{\Delta f_p}{\Delta f_o} + \sqrt{\left(\frac{\Delta f_p}{\Delta f_o}\right)^2 - 1} \qquad \frac{Y_p}{Y_c} = a^2$$

$$\frac{Y_c'}{Y_c} = \frac{a}{2\sqrt{\frac{\Delta f_p}{\Delta f_o}}\sqrt{\left(\frac{\Delta f_p}{\Delta f_o}\right)^2 - 1}} \qquad \frac{Y_c''}{Y_c} = \frac{a}{2} \cdot \frac{\Delta f_o}{\Delta f_p}$$

BRIDGED ELECTROMECHANICAL FILTERS

SUMMARY OF THE INVENTION

In an electromechanical filter using wire bridging for pole realization the image mobility of the unbridged section is made equal to the image mobility of the bridged section(s). A smoother attenuation in the passband and a better phase characteristic are obtained.

BACKGROUND OF THE INVENTION AND PRIOR ART

The present invention concerns improved electromechanical filters with two or more real or complex poles. It is known (see the article by R. A. Johnson, published in the Proceedings of the IEEE Symposium on Circuits and Systems—Newton, April 1975) to realize poles in the transmission characteristic by disposing auxiliary couplers across non-adjacent resonators which are hereinafter referred to as bridges. The use of bridges has been summed up in the aforesaid publication as follows (Table 1 of the above article):

| n Resonators below bridge | Phase | Attenuation Pole Location | length of bridge |
|---|---|---|---|
| EVEN | −1:1 | jω Axis- Above & below passband | 3λ/4 + pλ |
| EVEN | +1:1 | Complex- Right & Left Half-planes | 80 /4 + pλ |
| ODD | −1:1 | jω Axis- Below Filter passband | 3λ/4 + pλ |
| ODD | +1:1 | jω Axis- Above Filter passband | 80 /4 + pλ | where n is a positive integer other than zero p is a positive integer or zero, and λ is the wavelength at the central frequency of the filter in the vibration mode in which the bridge is operated.

As has been mentioned in the U.S. patent application Ser. No. 862,906 filed on Dec. 21, 1977 and now U.S. Pat. No. 4,163,960, assigned to the same Assignee as the present application for "Electromechanical filter structure", the bridge introduces into the passband variations of the transfer function which result in variations of amplitude in the transmitted band and undesirable modifications of the phase characteristic of the filter. It has been pointed out in the aforesaid application that these distortions decrease when the number of bridged resonators increases and are generally acceptable when this number reaches or exceeds four.

The present invention has essentially for its object to reduce the attenuation variations in the passband of a filter due to a bridge, and it is principally characterized in that the characteristics of the bridged cells are so designed that the image mobility of the bridged section is equal to that of the unbridged section.

In practice, where the number of bridged resonators is even, this condition can be met either through matching of the mobilities of the couplers of the bridged cells made of resonators identical over the whole structure, or using identical couplers for the bridged cells and modifying the mobility of the bridged resonators. Where the number of bridged resonators is odd, the condition affects the tuning frequencies of the bridged resonators and the mobility of one of the two parts of the bridged cells (either the coupler or the resonator).

The advantage of the improved filters according to the invention resides in their excellent performances in the passband with respect to both the attenuation and the phase. Experience has shown that the matching of the image mobilities of the bridged and unbridged sections provides correction of the attenuation, but also improves the phase characteristic in the transmitted band.

SHORT DESCRIPTION OF THE DRAWINGS

The invention will be readily understood from the following description and by reference to the accompanying FIGS. 1 to 10, which are given by way of non-limiting illustration and in which:

FIG. 1A is a diagrammatic representation of a filter characteristic for defining the references used, FIG. 1B is a diagrammatic representation of a filter characteristic for defining the references used, FIG. 2 is a diagrammatic representation of an example of a filter, FIG. 3 is a set of nomographs used in the design of the filter of FIG. 2, FIGS. 4 and 5 are characteristic curves of the filter of FIG. 2, FIG. 6 is a diagrammatic representation of a variant of filter, FIG. 7 is a set of nomographs employed in the design of the filter of FIG. 6, FIGS. 8 and 9 are characteristic curves of the filter of FIG. 6, and FIG. 10 is the amplitude characteristic curve of a third variant.

DETAILED DESCRIPTION OF THE DRAWINGS

Figure 1A:
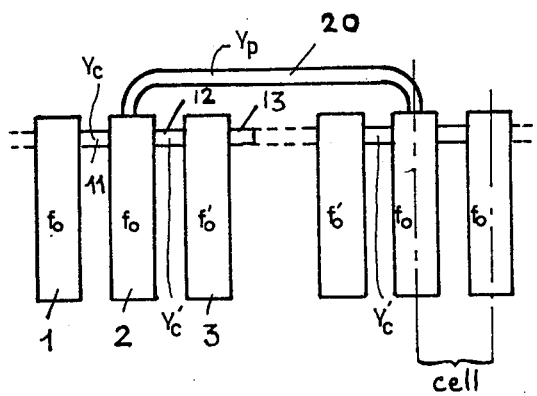

FIG. 1A diagrammatically illustrates the intermediate part of an electromechanical filter and the magnitudes by which it is characterized. It comprises resonators such as 1, 2, 3 . . . , connected by couplers 11, 12, . . . and a bridge 20. The terminal resonators (not shown) comprise transducers and input and output terminals. Since the invention is applicable regardless of the number of resonators constituting the filter, the number of resonators shown has no limiting character. The notation employed in the following are:

$Y_c$ = mobility of a coupler (11, 12, . . . ) of an unbridged cell $Y_p$ = mobility of the bridge 20

$f_o$ = central frequency of the passband = resonance frequency of the unbridged resonators (1 . . . )

Y = mobility of an unbridged resonator $Y_c'$, $Y_c''$, etc . . . = mobility of a coupler of a bridged cell Y', Y'', etc . . . = mobility of a resonator of a bridged cell $f_o'$, $f_o''$, etc . . . = resonance frequency of bridged resonators.

In cases where the filter comprises more than one bridge, the magnitudes relative to one bridge and to the cells situated under the said bridge are denoted by a common index 1, 2, . . . allocated to the bridge. As usual, the elemental cell of the filter comprises two half-resonators located on both sides of a coupler and the said coupler.

Figure 2:
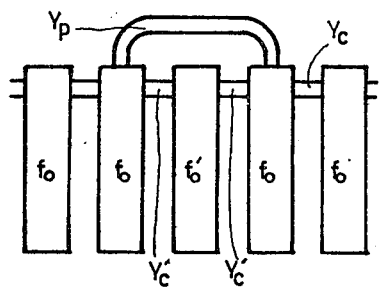
Figure 6:
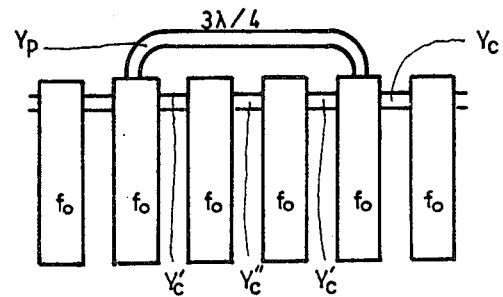

In FIGS. 2 and 6, the relationships between the aforesaid magnitudes are written which are derived from the condition of equality of the image mobility of the unbridged section of the filter with the bridged section. The design of a filter usually determines the characteristics of an elemental cell and the filter is considered as an assembly of such cells. The invention requires modification of the characteristics of the cells situated under the bridge to obtain equality of the overall mobility of the bridged cells with that of the unbridged cells. The relations which are explained with reference to the corresponding examples are to be met by the corresponding parts of the bridged cells.

Figure 1B:
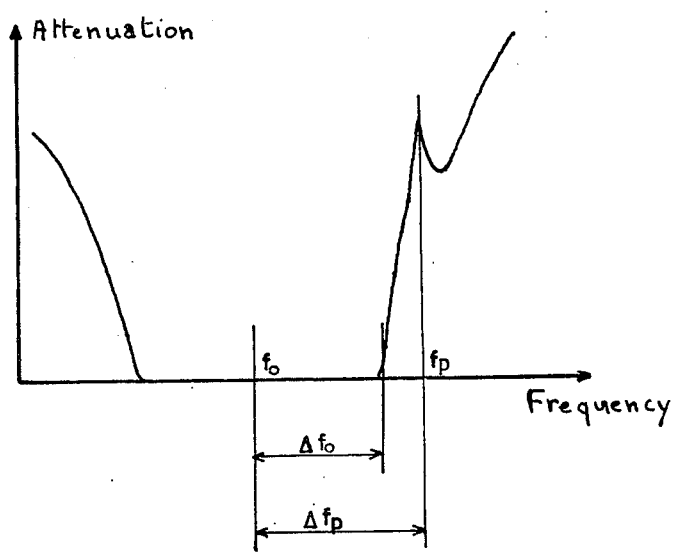

FIG. 1B diagrammatically illustrates an attenuation-frequency response. The attenuations in dB are plotted along the ordinates and the frequencies along the abscissae. $f_o$ is the central frequency of the passband limited by the frequencies $f_o + \Delta f_o$ and $f_o - \Delta f_o$. $\Delta f_o$ is therefore the passband half-width of the filter. The frequency of the pole or poles is $f_o(+ \text{ and/or } -)\Delta f_p$, the expression $\Delta f_p$ being indexed in the same way as the bridge which is the origin of the poles.

Figure 3:
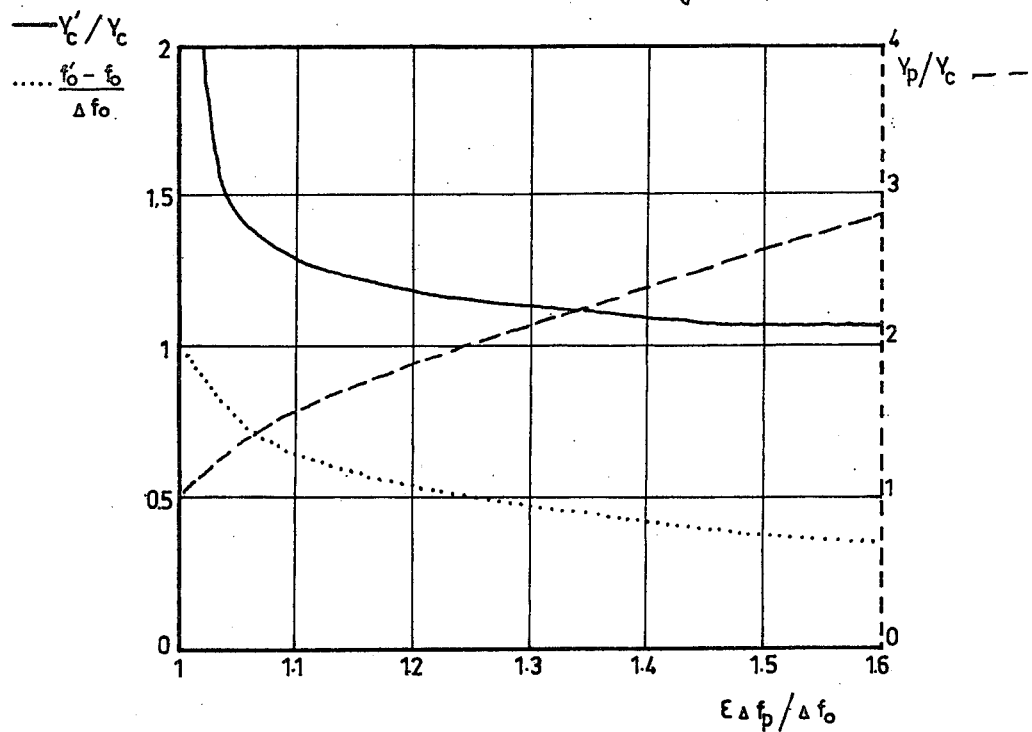

FIG. 2 diagrammatically illustrates a filter having a $\lambda/4$ or $3\lambda/4$ bridge on one resonator, so designed as to have a pole situated at $\Delta f_p = 1.16 \Delta f_o$ from the centre of the passband. FIG. 3 are the nomographs representing the variations, as a function of the relative value $\Delta f_p/\Delta f_o$ of ratios $Y_c'/Y_c$ $f_o'/f_o$ and $Y'/Y$ characterizing the paramaters of the bridged cells. These monographs are obtained from the relations expressed under FIG. 2, which translate the matching condition of the image mobilities. The design was made at $\Delta f_p/\Delta f_o = 1.16$.

Figure 4:
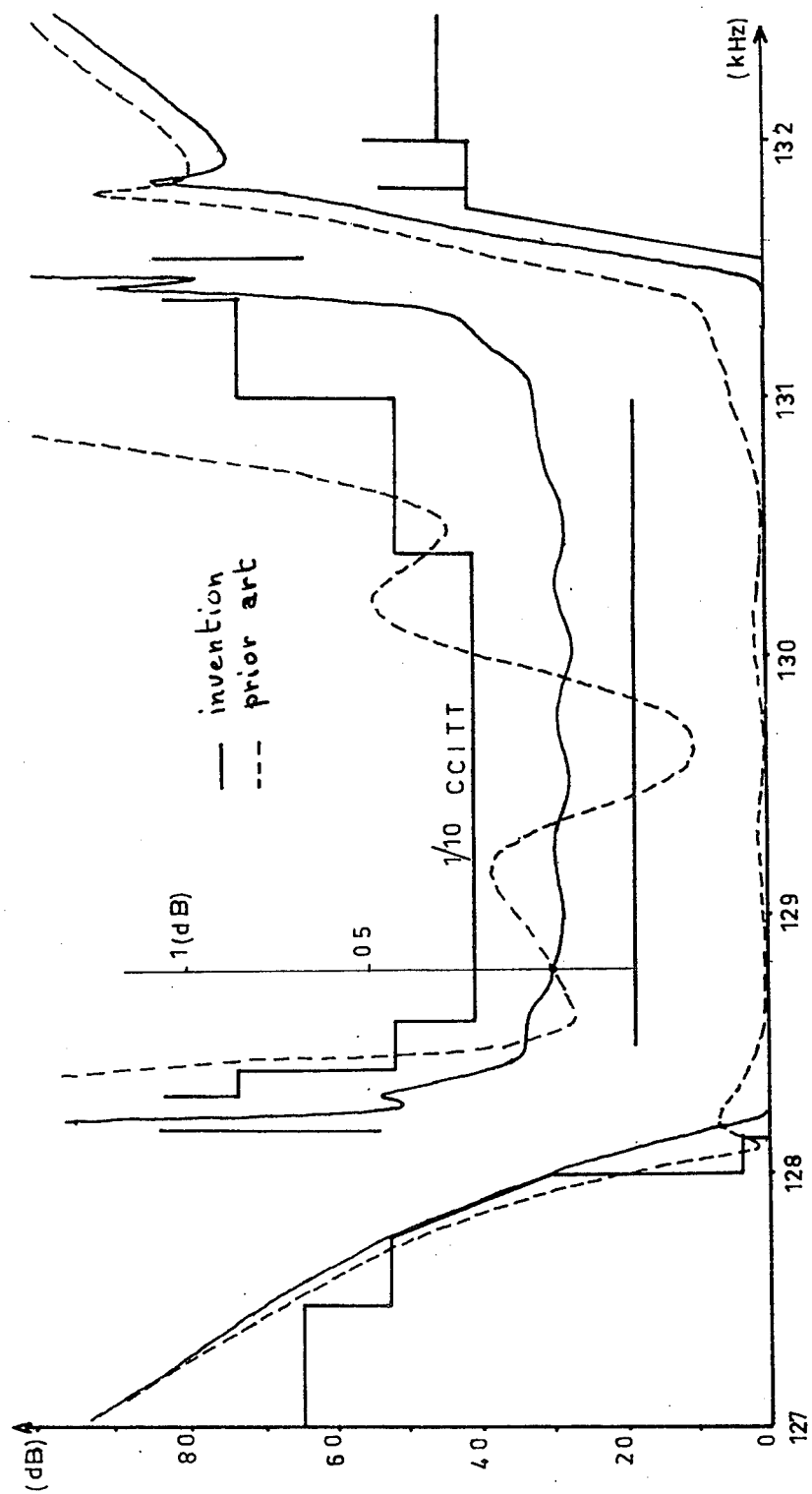
Figure 5:
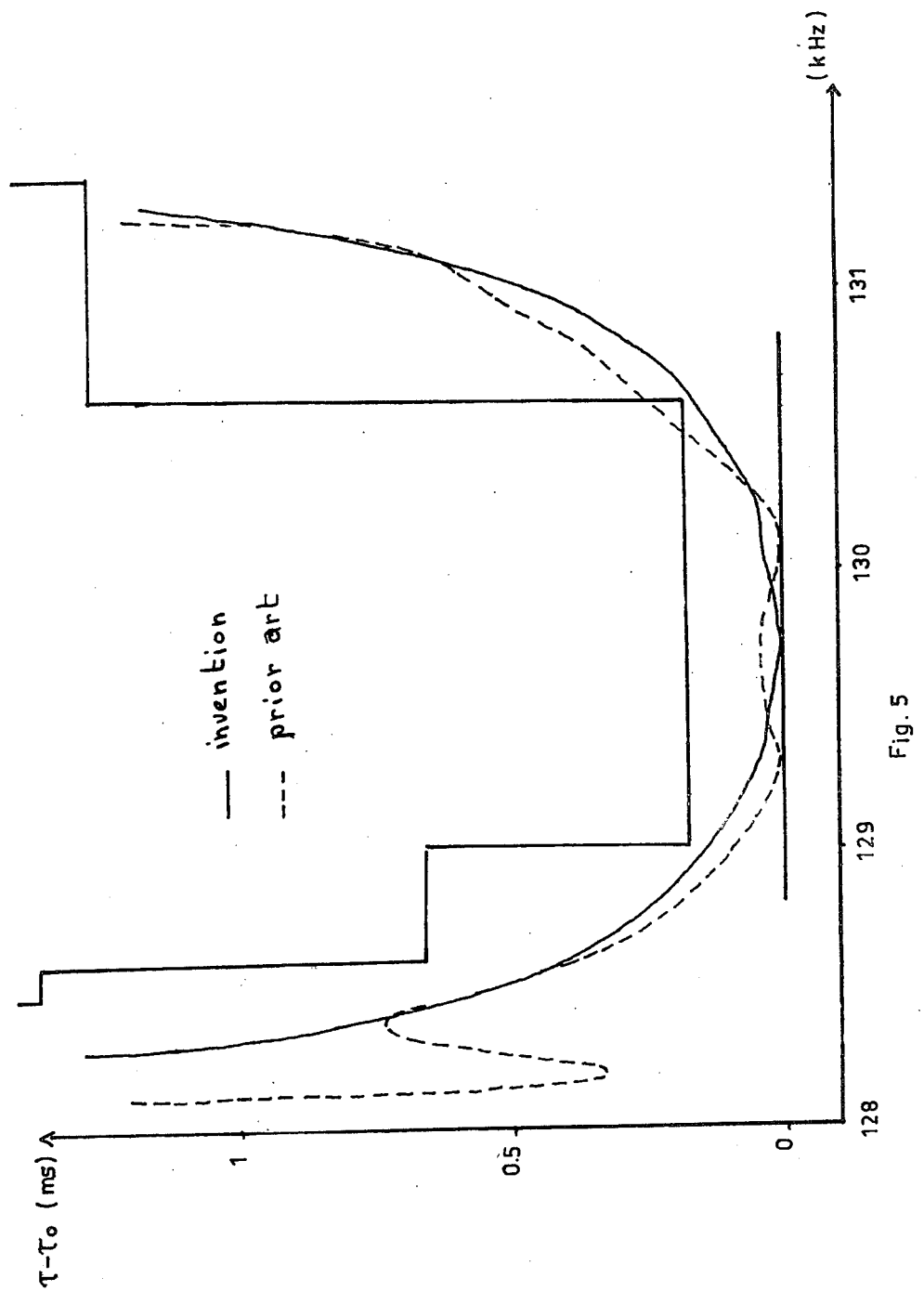

In FIGS. 4 and 5 the solid lines are the characteristic curves of a filter according to the invention using a $\lambda/4 + p\lambda$ bridge on one resonator and made of thirteen resonators. Such a filter has a real pole at a frequency above the passband (cf. foregoing table). Meeting the condition of equality of the image mobilities makes it possible to retain, for the bridged cells, the mobility of one of the two parts (either the coupler or the resonator) equal to the value of that of the same part of an unbridged cell. The construction corresponding to the characteristics of FIGS. 4 and 5 was made of Elinvar. The resonators are identical in the bridged and unbridged cells.

The resonators are $\lambda/2$ wires having a length of 18 mm.

The couplers are $\lambda/4$ wires having a length of 4 mm.
The diameter of the bridge wire is 0.9 mm.
The parameters of the bridged cells are determined with the aid of the nomographs of FIG. 3.

The interrupted lines in FIGS. 4 and 5 correspond to the same filter in which the cells are identical (bridged and unbridged) to the unbridged cells of the filter according to the invention. The advantages, both from the viewpoint of attenuation in the band and from the viewpoint of phase of the filter according to the invention are apparent. The CCITT gauges are shown in the figure as a reference.

FIG. 6 is a diagrammatic representation of a variant of a filter comprising a $3\lambda/4 + p\lambda$ bridge over two resonators. In accordance with the theory (cf. foregoing table), such a filter has two poles symmetrical about $f_o$.

Figure 7:
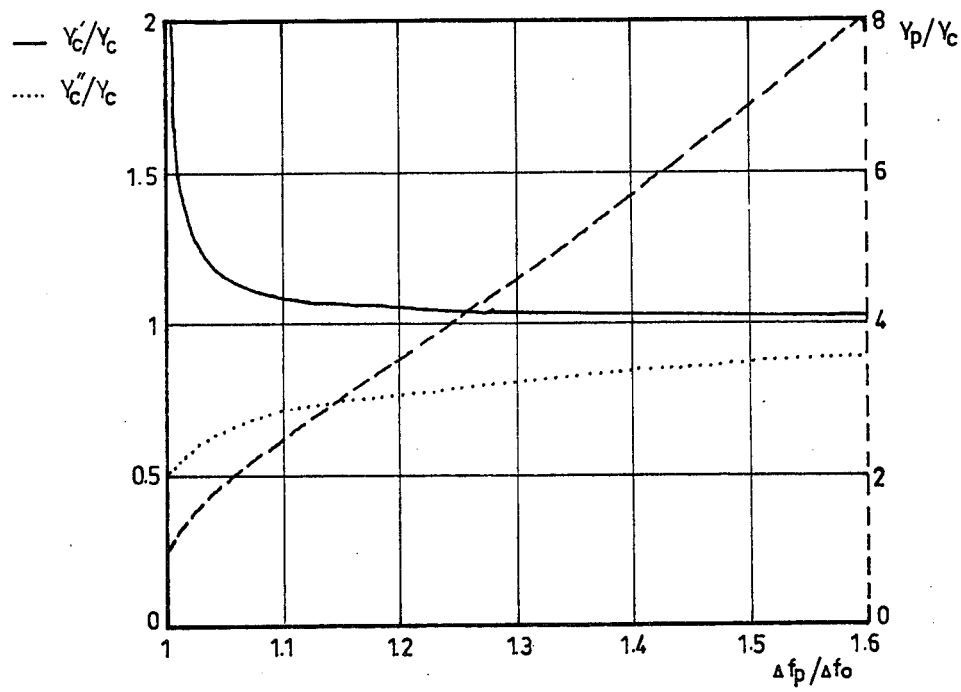
Figure 8:
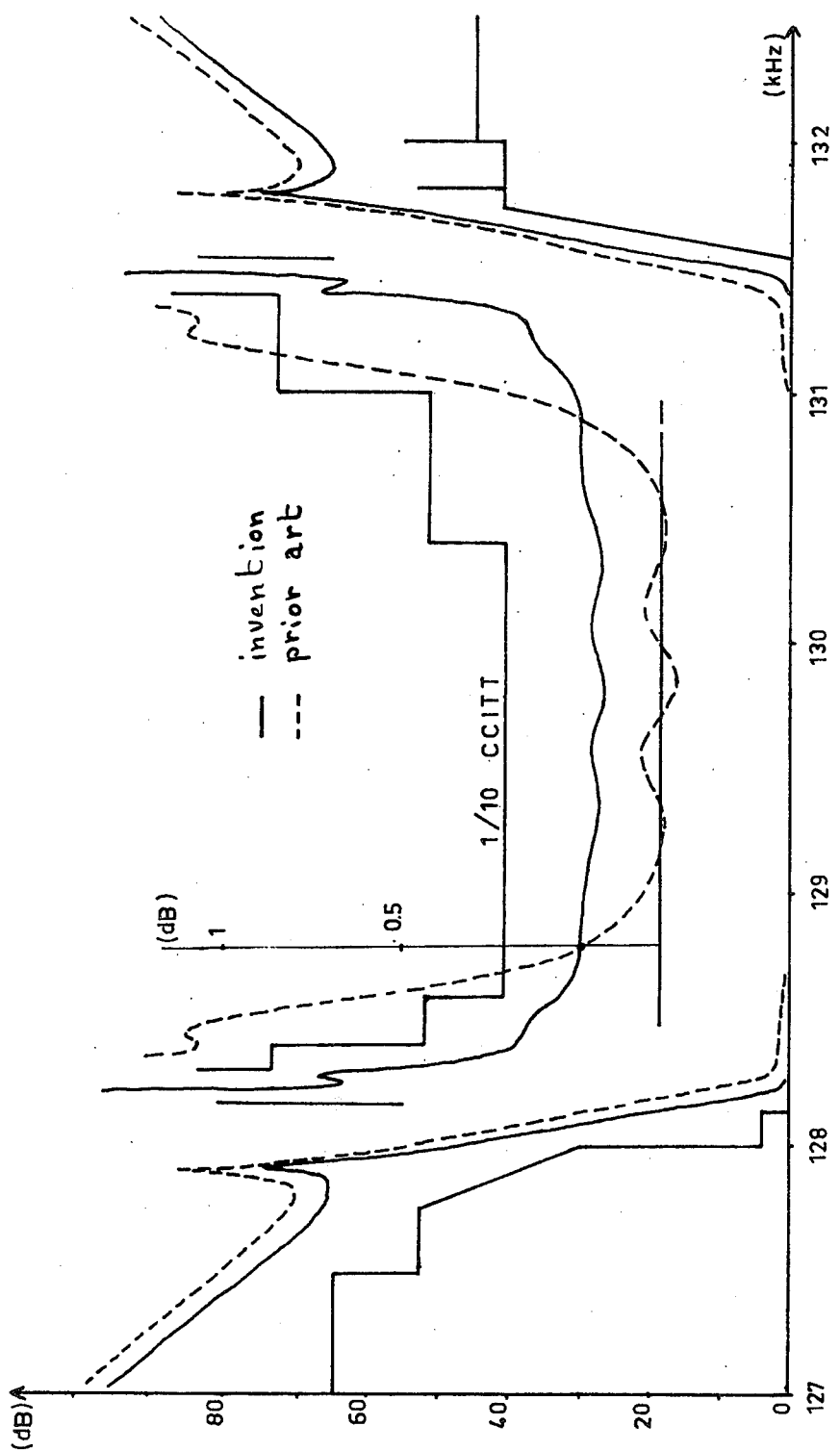
Figure 9:
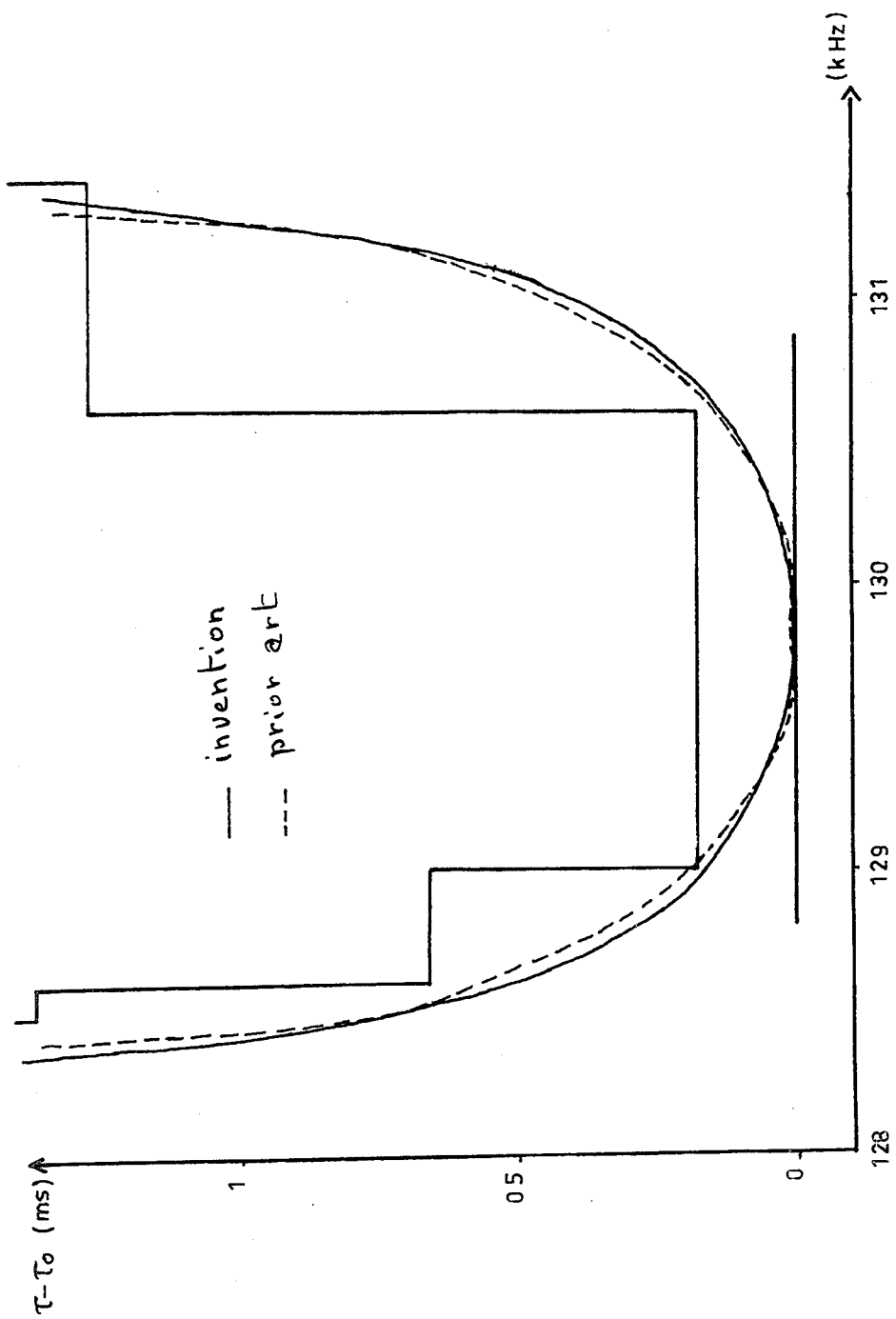

FIG. 7 shows the nomographs corresponding to those of FIG. 3 which are applicable to the variant under consideration, the relations resulting from the equality of the image mobilities appear below FIG. 6, and FIGS. 8 and 9 illustrate the attenuation and group time delay characteristics under the same conditions as FIGS. 4 and 5 relative to the first variant. The filter comprises thirteen resonators; the poles are at $f_o \pm \Delta f_p$, with $\Delta f_p = 1.16 \Delta f_o$. This construction was made of Elinvar. The resonators are $\lambda/2$ wires 18 mm long, the couplers are $\lambda/4$ wires 4 mm long and the diameter of the $3\lambda/4$ bridge is 0.7 mm. The couplers are made identical in the bridged and unbridged cells. The other parameters of the bridged cells are determined with the aid of the nomographs of FIG. 7.

Figure 10:
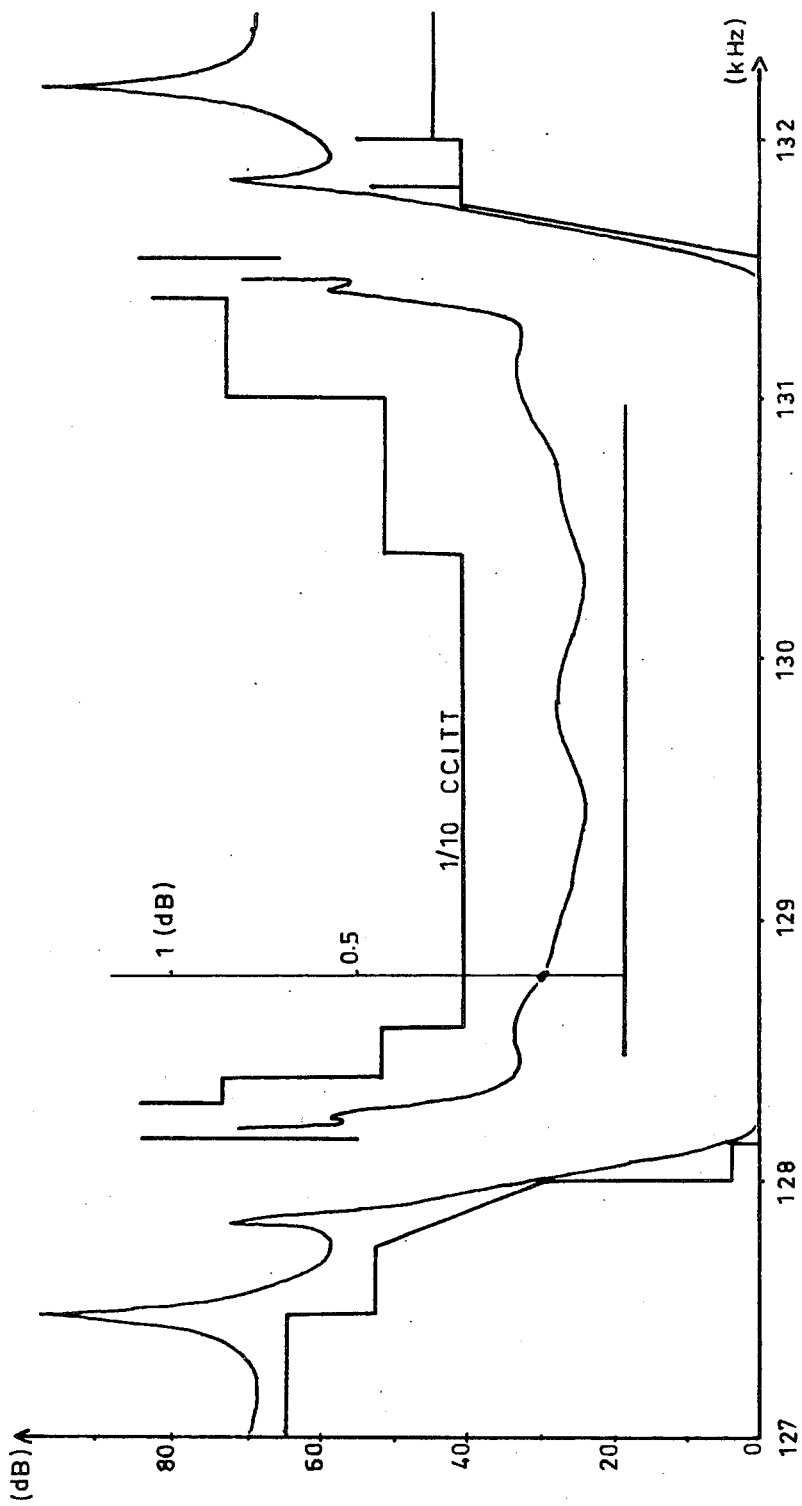

FIG. 10 is the attenuation characteristic curve of a filter with ten resonators comprising two $3\lambda/4 + p\lambda$ bridges each over two resonators. The characteristic shows two pairs of poles. The dimensions of the bridges are so chosen that these poles are at the frequencies $f_o \pm \Delta f_{p1}$ and $f_o \pm \Delta f_{p2}$, with $\Delta f_{p1} = 1.16 \Delta f_o$ and $\Delta f_{p2} = 1.38 \Delta f_o$. As in the preceding examples, the filter is made of Elinvar. The resonators are identical in all the cells whether bridged or unbridged, and consist of $\lambda/2$ wires 18 mm. long and the couplers of the unbridged cells are $\lambda/4$ wires 4 mm. long. The diameters of the bridges are 0.7 mm and 0.55 mm. respectively. The other parameters of the bridged cells are determined with the aid of nomographs similar to those of FIGS. 3 and 7 referred to in the foregoing.

It is obvious that the invention is applicable regardless of the vibration mode of the resonators and of the couplers and regardless of the central frequency of the transmitted band. The examples chosen in the foregoing, which correspond to a practical application, have these characteristics in common: the resonators are longitudinally excited and the couplers and bridges are operated on the fondamental flexural mode.

What we claim:

1. An electromechanical band pass filter having at least one real pole consisting of vibrating resonators and couplers between said resonators, arranged as filter cells connected in parallel each comprising a coupler and half of each of the adjacent resonators; and at least one bridge over at least one resonator; the image mobility of the cells situated under the bridge being equal to the image mobility of the cells in an unbridged electromechanical filter of the same type having the same passband.

2. Electromechanical filter structure according to claim 1 having one real pole, wherein the electrical length of the bridge is an odd number of quarter-wavelengths at flexural mode and the resonators of all the cells, whether bridged or unbridged, are identical and vibrate longitudinally.

3. Filter structure according to claim 1 having a real pole, wherein the couplers of all the cells are identical.

4. Filter structure according to claim 1, comprising one bridge over an odd number of bars and wherein all the cells are made of the same resonator.

5. Filter structure according to claim 1, comprising one bridge over an even number of resonators and wherein all the cells are made of the same coupler.

6. Filter structure according to claim 1, comprising a number of bridges, the cells spanned by at least one bridge being so modified that the image mobility of the assembly of the said spanned cells is equal to that of an unbridged cell.

* * * * *